United States Patent
Juco et al.

(10) Patent No.: US 11,557,460 B2
(45) Date of Patent: Jan. 17, 2023

(54) RADIO FREQUENCY (RF) SIGNAL SOURCE SUPPLYING RF PLASMA GENERATOR AND REMOTE PLASMA GENERATOR

(71) Applicant: LAM RESEARCH CORPORATION, Fremont, CA (US)

(72) Inventors: Eller Y. Juco, Tualatin, OR (US); Karl Frederick Leeser, West Linn, OR (US); Huatan Qiu, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 24 days.

(21) Appl. No.: 17/258,584

(22) PCT Filed: Jul. 8, 2019

(86) PCT No.: PCT/US2019/040784
§ 371 (c)(1),
(2) Date: Jan. 7, 2021

(87) PCT Pub. No.: WO2020/014113
PCT Pub. Date: Jan. 16, 2020

(65) Prior Publication Data
US 2021/0257188 A1    Aug. 19, 2021

Related U.S. Application Data

(60) Provisional application No. 62/695,693, filed on Jul. 9, 2018.

(51) Int. Cl.
*H01J 37/32*    (2006.01)

(52) U.S. Cl.
CPC .. *H01J 37/32183* (2013.01); *H01J 37/32357* (2013.01); *H01J 37/32449* (2013.01)

(58) Field of Classification Search
CPC .......... H01J 37/32183; H01J 37/32174; H01J 37/32357; H01J 37/32449; H01J 37/3299
See application file for complete search history.

(56) References Cited

U.S. PATENT DOCUMENTS

| | | | |
|---|---|---|---|
| 2002/0011210 A1* | 1/2002 | Satoh | H01J 37/32862 118/723 R |
| 2002/0020429 A1* | 2/2002 | Selbrede | H01J 37/32862 219/121.36 |

(Continued)

FOREIGN PATENT DOCUMENTS

| | | |
|---|---|---|
| KR | 1020080092830 A | 10/2008 |
| KR | 1020100066994 A | 6/2010 |

OTHER PUBLICATIONS

International Search Report and Written Opinion of the ISA issued in PCT/US2019/040784, dated Oct. 31, 2019; ISA/KR.

*Primary Examiner* — Tung X Le

(57) ABSTRACT

A multi-signal radio frequency (RF) source includes an RF source; and a switch including an input in communication with an output of the RF source, a first output and a second output. The switch is configured to selectively connect the input to one of the first output and the second output. An RF generator in communication with the first output of the multi-signal RF source is configured to generate plasma in a processing chamber. A remote plasma generator in communication with the second output of the multi-signal RF source is configured to supply remote plasma to the processing chamber.

22 Claims, 3 Drawing Sheets

(56) References Cited

U.S. PATENT DOCUMENTS

| | | | |
|---|---|---|---|
| 2003/0079757 A1* | 5/2003 | Shibata | C23C 16/4405 219/121.36 |
| 2008/0241420 A1 | 10/2008 | Dhindsa et al. | |
| 2008/0251207 A1* | 10/2008 | Chen | H01J 37/32165 156/345.48 |
| 2009/0139453 A1* | 6/2009 | Chen | H01J 37/32449 118/723 I |
| 2010/0276391 A1 | 11/2010 | Grimbergen et al. | |
| 2014/0162462 A1 | 6/2014 | Trachuck et al. | |

* cited by examiner

RADIO FREQUENCY (RF) SIGNAL SOURCE SUPPLYING RF PLASMA GENERATOR AND REMOTE PLASMA GENERATOR

CROSS-REFERENCE TO RELATED APPLICATIONS

This application is a U.S. National Phase Application under 35 U.S.C. 371 of International Application No. PCT/US2019/040784, filed on Jul. 8, 2019, which claims the benefit of U.S. Provisional Application No. 62/695,693, filed on Jul. 9, 2018. The entire disclosures of the applications referenced above are incorporated herein by reference.

FIELD

The present disclosure relates to substrate processing systems, and more particularly to an RF signal source supplying an RF plasma generator and a remote plasma generator.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, chemical vapor deposition (CVD), plasma enhanced chemical vapor deposition (PECVD), atomic layer deposition (ALD), atomic layer etch (ALE), plasma enhanced atomic layer deposition (PEALD) and/or other etch, deposition, and cleaning processes.

During processing, a substrate is arranged on a substrate support, such as a pedestal, an electrostatic chuck (ESC), etc. in a processing chamber of the substrate processing system. A process gas mixture is introduced into the processing chamber to treat the substrate. In some examples, plasma may be struck to enhance chemical reactions within the processing chamber.

After a predetermined interval or processing of a predetermined number of substrates, the processing chamber may be cleaned. Some processing chambers include a remote plasma generator that generates plasma externally and supplies the plasma to the processing chamber to remove buildup of film or other substances on interior surfaces of the processing chamber.

SUMMARY

A multi-signal radio frequency (RF) source includes an RF source; and a switch including an input in communication with an output of the RF source, a first output and a second output. The switch is configured to selectively connect the input to one of the first output and the second output. An RF generator in communication with the first output of the multi-signal RF source is configured to generate plasma in the processing chamber. A remote plasma generator in communication with the second output of the multi-signal RF source is configured to supply remote plasma to the processing chamber.

In other features, the multi-signal RF source further includes a filter connected to the first output and not to the second output. The RF generator is connected to the filter.

In other features, the RF source supplies a periodic signal. The filter includes a low pass filter to pass a fundamental frequency of the output of the RF source. The filter includes a band pass filter to pass at least one harmonic of the output of the RF source and to block another harmonic of the output of the RF source.

In other features, a controller is configured to control the RF generator, the remote plasma generator and the switch. The controller is configured to set a state of the switch to one of a first state and a second state; cause the switch to connect the RF source to the first output and to not connect the RF source to the second output when the first switch is in the first state; and cause the switch to the switch connect the RF source to the second output and to not connect the RF source to the first output when the first switch is in the second state.

A method for supplying RF power in a substrate processing system for processing substrates includes providing an RF source and a switch including an input in communication with an output of the RF source, a first output and a second output; connecting an RF generator, configured to generate plasma in the processing chamber, to the first output of the multi-signal RF source; connecting a remote plasma generator, configured to supply remote plasma to clean the processing chamber, to the second output of the multi-signal RF source; and selectively connecting the input to one of the first output and the second output using the switch.

In other features, the method includes supplying a first gas mixture to the processing chamber; and supplying a second gas mixture to the remote plasma generator. The method includes arranging a filter between the first output of the switch and the RF generator.

The method includes supplying a periodic signal using the RF source. The method includes, using the filter, passing a fundamental frequency of the output of the RF source. The method includes, using the filter, passing at least one harmonic of the output of the RF source and blocking another harmonic of the output of the RF source.

In other features, the method includes setting a state of the switch to one of a first state and a second state; connecting the RF source to the first output and not connecting the RF source to the second output when the first switch is in the first state; and connecting the RF source to the second output and not connecting the RF source to the first output when the first switch is in the second state.

A method for supplying RF power in a substrate processing system for processing substrates includes providing an RF source; selectively supplying power from the RF source to an RF generator, configured supply RF power to a component in the processing chamber, while not supplying power from the RF source to the remote plasma generator; and selectively supplying power from the RF source to the remote plasma generator, configured to supply remote plasma to the processing chamber, while not supplying power from the RF source to the RF generator.

In other features, the method includes supplying a first gas mixture to the processing chamber; and supplying a second gas mixture to the remote plasma generator. The method includes supplying a periodic signal using the RF source. The method includes passing a fundamental frequency of an output of the RF source to the RF generator. The method includes passing at least one harmonic of an output of the RF source to the RF generator while blocking another harmonic of the output of the RF source to the RF generator.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Different components of substrate processing systems may require RF signal sources to supply RF signals. Sometimes the components are not operated at the same time during operation of the substrate processing system. For example, an RF generator that generates plasma during substrate treatment and a remote plasma generator that supplies remote plasma for chamber cleaning are not typically operated at the same time.

To reduce system cost, an RF source according to the present disclosure supplies a first RF signal to a first component of a substrate processing system during first time periods and a second RF signal to a second component of the substrate processing system during second time periods (where the first and second time periods are non-overlapping). In other words, the RF source is time multiplexed. As a result, only one RF source is required to supply two or more components of the substrate processing system and the cost associated with at least one RF source can be eliminated.

In some examples, the first RF signal and the second RF signal have the same frequency but are different types of waveforms. In other examples, the first RF signal and the second RF signal are the same. In still other examples, the first RF signal and the second RF signal have different frequencies and are different types of waveforms.

In some examples, the first component of the substrate processing system includes a remote plasma generator (also called remote plasma source) and the second component of the substrate processing system includes an RF generator. In some examples, the first RF signal is periodic signal and the second RF signal is a sinusoidal signal. Non-limiting examples of periodic signals include square wave signals, sawtooth signals, triangular signals, sinusoidal signals, etc.

When supplying the first RF signal, a switch of the RF source supplies the periodic signal to the remote plasma generator. When supplying the second RF signal, the switch of the RF source supplies the periodic signal to a filter. In some examples, the filter includes a low pass filter to filter a fundamental frequency of the periodic signal to generate the sinusoidal signal. Alternately, a band pass filter can be used to filter another harmonic (such as a third, fifth, or other harmonic) of the periodic signal to generate the sinusoidal signal at a different frequency than the periodic signal. The sinusoidal signal that is output by the filter is supplied to the RF generator.

In other examples, the filters are omitted and other signal processing may be performed. For example, post processing such as inversion, rectification, etc. can be performed.

Figure 1:
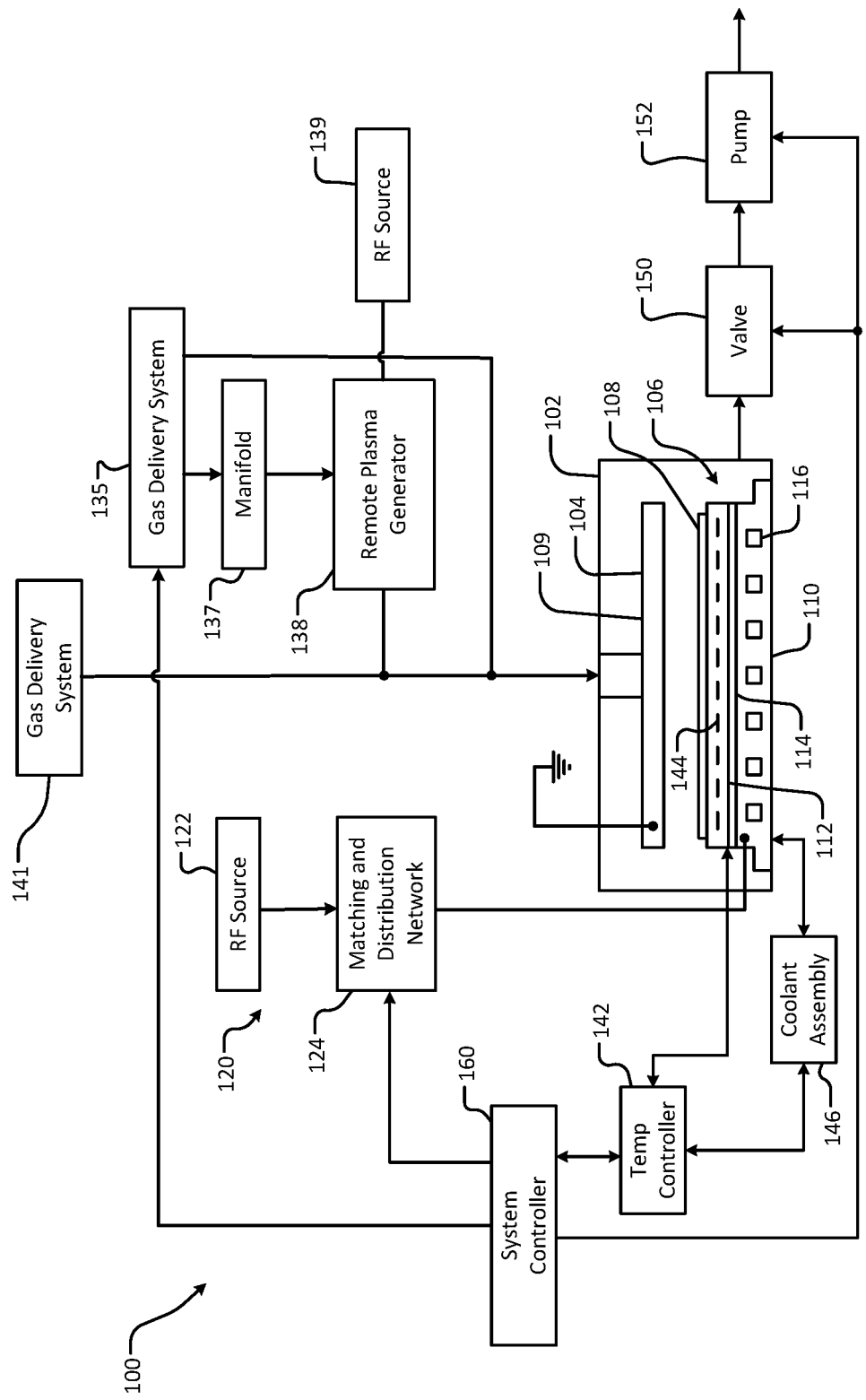
FIG. 1 is a functional block diagram of an example of a substrate processing system including an RF generator and a remote plasma generator.

Referring now to FIG. 1, an example substrate processing system 100 for performing substrate treatment such as etching, deposition or other treatment using RF plasma is shown. The substrate processing system 100 includes a processing chamber 102 that encloses other components of the substrate processing system 100 and contains the RF plasma. The substrate processing system 100 includes an upper electrode 104 and a substrate support 106, such as an electrostatic chuck (ESC). During operation, a substrate 108 is arranged on the substrate support 106.

For example only, the upper electrode 104 may include a showerhead 109 that introduces and distributes process and clean gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The baseplate 110 supports a heating plate 112, which may correspond to a ceramic multi-zone heating plate. The substrate support 106 includes a baseplate 110 that acts as a lower electrode. A thermal resistance layer 114 may be arranged between the heating plate 112 and the baseplate 110. The baseplate 110 may include one or more coolant channels 116 for flowing coolant through the baseplate 110.

An RF generator 120 generates and outputs RF power to one of the upper electrode 104 and the lower electrode (e.g., the baseplate 110 of the substrate support 106). The other one of the upper electrode and the lower electrode may be DC grounded, AC grounded or floating. For example only, the RF generator 120 includes an RF source 122 supplying RF power and a matching and distribution network 124 to match an impedance of the upper electrode 104 or the baseplate 110. In some examples, the RF source 122 supplies a sinusoidal signal at a first predetermined frequency.

A first gas delivery system 135 includes one or more gas sources supplying one or more reactive gases, inert gases or other types of gases. In some examples, the reactive gas includes a halogen gas species. The first gas delivery system 135 includes one or more gas sources connected by one or more primary valves, mass flow controllers (MFC) and/or secondary valves (all not shown) to a mixing manifold 137, which is in fluid communication with a remote plasma generator 138. In some examples, the remote plasma generator 138 includes a microwave-based remote plasma generator, a plasma tube or other type of remote plasma generator.

An RF source 139 supplies an RF signal to the remote plasma generator 138. In some examples, the RF source 139 supplies a periodic signal at a second predetermined frequency, which can be the same as or different than the first predetermined frequency. The remote plasma generator 138 generates remote plasma that is selectively supplied to the processing chamber 102.

A second gas delivery system 141 may include one or more primary valves, mass flow controllers (MFC) and/or secondary valves (not shown) for delivering other gases or gas mixtures such carrier gases, gas precursors and/or purge gases for use during substrate treatment (e.g. prior to chamber cleaning) and/or for purging the processing chamber. In some examples, the first and second gas delivery systems 138 and 141, respectively, are combined.

A temperature controller 142 may be connected to a plurality of thermal control elements (TCEs) 144 arranged in the heating plate 112. A temperature controller 142 may be used to control the plurality of TCEs 144 to adjust a temperature of the substrate support 106 and the substrate 108.

The temperature controller 142 may communicate with a coolant assembly 146 to control coolant flow through the coolant channels 116. For example, the coolant assembly 146 may include a coolant pump and reservoir. The temperature controller 142 operates the coolant assembly 146 to selectively flow the coolant through the coolant channels 116 to control the temperature of the substrate support 106.

A valve 150 and pump 152 may be used to control pressure and/or evacuate reactants from the processing chamber 102. A system controller 160 may be used to control components of the substrate processing system 100. Although shown as separate controllers, the temperature controller 142 may be implemented within the system controller 160.

Figure 2:
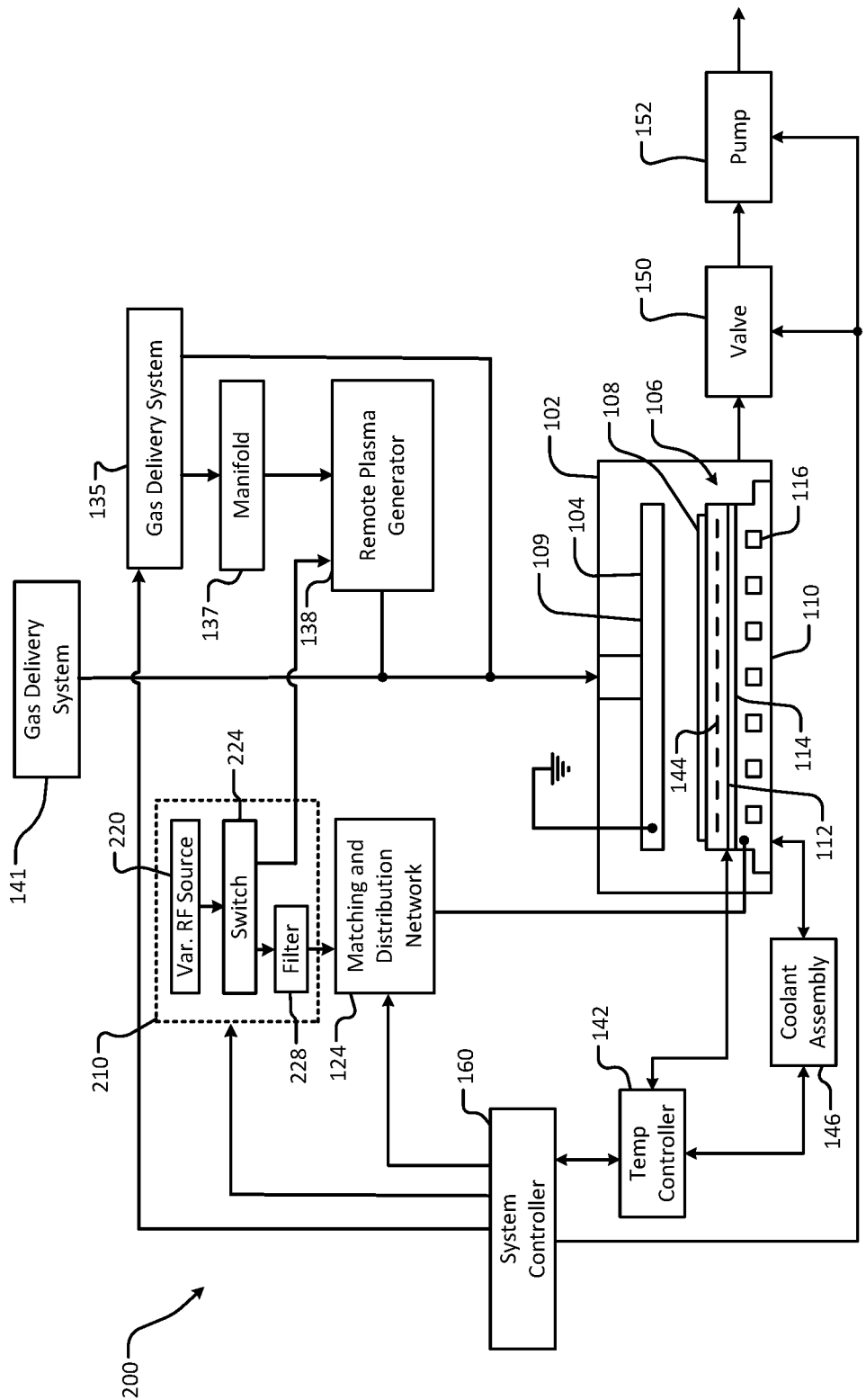
FIG. 2 is a functional block diagram of an example of a substrate processing system including an RF generator and a remote plasma generator sharing an RF source according to the present disclosure.

Referring now to FIG. 2, a substrate processing system 200 according to the present disclosure includes a multi-signal RF source 210 that operates in two or more modes. The multi-signal RF source 210 operates in a first mode to supply a first RF signal to a first component of the substrate processing system. The multi-signal RF source 210 operates in a second mode to supply a second RF signal to a second component of the substrate processing system. For example, the multi-signal RF source 210 supplies RF power to the remote plasma generator in the first mode to generate remote plasma that is delivered to the processing chamber during chamber cleaning (when substrates are typically not present). In the second mode, the multi-signal RF source 210 supplies RF power to the RF generator to generate plasma in the processing chamber during substrate treatment.

In some examples, the multi-signal RF source 210 supplies a periodic signal with RF power in a range from 50 W to 20 kW, although other power levels can be used. In some examples, the periodic output by the RF generator 210 is in a frequency range from 360 kHz to 440 kHz, although other frequency ranges can be used. In some examples, the RF generator 210 supplies a sinusoidal signal at similar power levels and frequency ranges.

In some examples, the multi-signal RF source 210 includes a variable RF source 220 that supplies a periodic signal at a predetermined frequency and a predetermined amplitude. The variable RF source 220 outputs the periodic signal to a switch 224 that is set to a first state when operating in the first mode. The switch 224 can be positioned in a second state when operating in the second mode. When the switch 224 is in the first state, the periodic signal is output via a first output of the switch 224 to the remote plasma generator 138. When operating in the second state, a second output of the switch is input to a filter 228 having an output that communicates with the matching and distribution network 124.

In some examples, the filter 228 is a low pass filter that passes a fundamental frequency corresponding to a desired frequency of the sinusoidal signal. In other examples, the filter 228 includes a band pass filter to filter one or more harmonics of the periodic (while blocking other harmonics). In other words, the filter 228 rejects signal power at frequencies outside of a desired frequency band. The filter 228 generates a filtered output signal that is a sinusoidal signal. The sinusoidal signal is output to the matching and distribution network 124.

Figure 3:
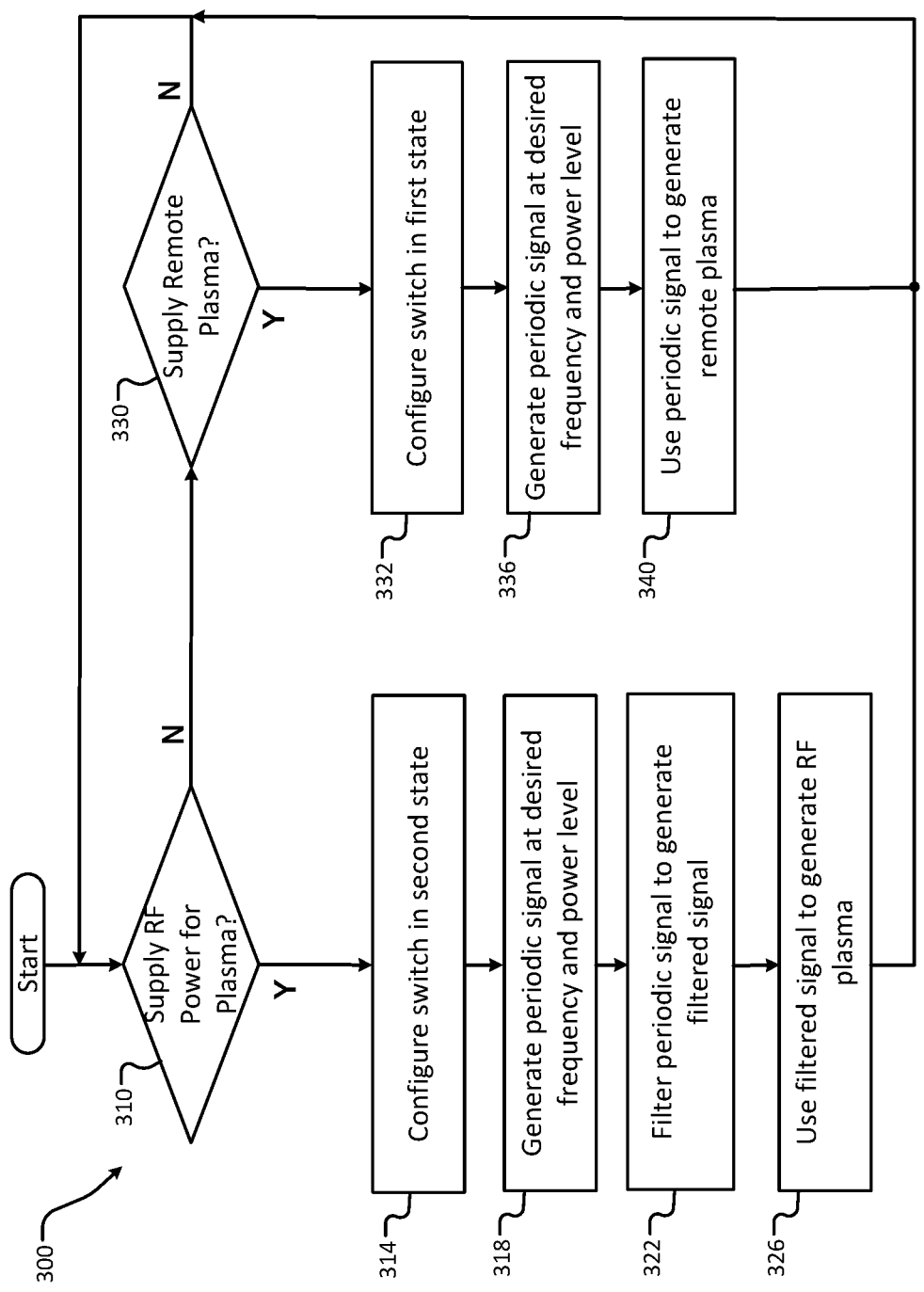
FIG. 3 is a flowchart of an example of a method for operating the RF source of FIG. 2.

Referring now to FIG. 3, a method 300 for operating an RF source is shown. At 310, the method determines whether there is a request to supply RF power to generate plasma in the processing chamber. If 310 is true, the switch 224 is configured in a second state at 314. At 318, the RF source generates a periodic signal at a desired frequency and power level. In some examples, the periodic signal is a square wave although other periodic signals such as sawtooth waves, sinusoidal waves, triangular waves, etc. can be used. In some examples, the periodic signal may have the same shape during positive and negative half cycles or a different shape during positive and negative half cycles.

At 322, a filter may be used to eliminate spurious signals and/or one or more harmonics. In some examples, a low pass filter is used to pass a fundamental frequency (or another harmonic) corresponding to a desired frequency of the sinusoidal signal while blocking other signal content at higher frequencies. In other examples, a band pass filter is used. At 326, the filtered signal is output to the RF generator to generate RF plasma in the processing chamber. In some examples, the square wave signal is filtered and the filtered signal is sinusoidal.

If 310 is false, the method continues at 330 and determines whether remote plasma is to be supplied. If 330 is true, the method configures the switch in the first state at 332. At 336, the RF source generates a periodic signal at a desired frequency and power level. At 340, the periodic signal is output to the remote plasma generator. In still other examples, filtering is performed on the periodic signal for both remote plasma and RF plasma.

While a specific example is presented above, the present disclosure may be used in other situations. More particularly, one or more power supplies (that are normally connected to process plasma sources) are alternatively connected to one or more alternative plasma sources under mutually exclusive conditions. The power supplies may be direct current (DC), alternating current (AC), RF, or higher frequency. The signal connected to the alternate source may be extracted topologically upstream of the device output or may be post processed (to generate alternate waveforms) prior to connection to the alternate plasma source.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system comprising:
    a power source having an output; and
    a switch having an input connected to the output of the power source, a first output, and a second output, wherein the switch is configured to selectively connect the input to one of the first output and the second output;
    a first plasma generator connected to the first output of the switch and configured to generate a first plasma in a processing chamber; and
    a remote plasma generator connected to the second output of the switch and configured to supply remote plasma to the processing chamber.

2. The system of claim 1, further comprising:
    a filter connected to the first output and not to the second output,
    wherein the first plasma generator is connected to the filter.

3. The system of claim 2, wherein the power source supplies a periodic signal.

4. The system of claim 2, wherein the filter passes a fundamental frequency of the output of the power source.

5. The system of claim 2, wherein the filter passes at least one harmonic of the output of the power source and blocks another harmonic of the output of the power source.

6. The system of claim 2, further comprising:
a matching circuit connected to the filter,
wherein the first plasma generator is connected to the filter.

7. The system of claim 1, further comprising a controller configured to control the first plasma generator, the remote plasma generator and the switch.

8. The system of claim 7, wherein the controller is configured to:
set a state of the switch to one of a first state and a second state;
cause the switch to connect the power source to the first output and to not connect the power source to the second output when the switch is in the first state; and
cause the switch to the switch connect the power source to the second output and to not connect the power source to the first output when the switch is in the second state.

9. A substrate processing system comprising
the system of claim 1;
the processing chamber; and
a gas delivery system configured to selectively supply a first gas mixture to the processing chamber and a second gas mixture to the remote plasma generator.

10. The system of claim 1, further comprising:
a matching circuit connected to the first output and not to the second output,
wherein the first plasma generator is connected to the matching circuit.

11. A method for supplying power, comprising:
providing a power source and a switch including an input in communication with an output of the power source, a first output, and a second output;
connecting a first plasma generator, configured to generate a first plasma in a processing chamber, to the first output of the switch;
connecting a remote plasma generator, configured to supply remote plasma to clean the processing chamber, to the second output of the switch; and
selectively connecting the input to one of the first output and the second output using the switch.

12. The method of claim 11, further comprising:
supplying a first gas mixture to the processing chamber; and
supplying a second gas mixture to the remote plasma generator.

13. The method of claim 11, further comprising arranging a filter between the first output of the switch and the first plasma generator.

14. The method of claim 13, further comprising supplying a periodic signal using the power source.

15. The method of claim 14, further comprising, using the filter, passing a fundamental frequency of the output of the power source.

16. The method of claim 14, further comprising, using the filter, passing at least one harmonic of the output of the power source and blocking another harmonic of the output of the power source.

17. The method of claim 11, further comprising:
setting a state of the switch to one of a first state and a second state;
connecting the power source to the first output and not connecting the power source to the second output when the switch is in the first state; and
connecting the power source to the second output and not connecting the power source to the first output when the switch is in the second state.

18. A method for supplying power in a substrate processing system for processing substrates, comprising:
providing a power source;
selectively supplying power from the power source to a component in a processing chamber to generate a first plasma in the processing chamber, while not supplying power from the power source to a remote plasma generator; and
selectively supplying power from the power source to the remote plasma generator, configured to supply remote plasma to the processing chamber, while not supplying power from the power source to the component in the processing chamber.

19. The method of claim 18, further comprising:
supplying a first gas mixture to the processing chamber; and
supplying a second gas mixture to the remote plasma generator.

20. The method of claim 18, further comprising supplying a periodic signal using the power source.

21. The method of claim 20, further comprising passing a fundamental frequency of an output of the power source to the component in the processing chamber.

22. The method of claim 20, further comprising passing at least one harmonic of an output of the power source to the component in the processing chamber while blocking another harmonic of the output of the power source to the component in the processing chamber.

* * * * *